United States Patent

Zlotnick

[15] 3,651,411

[45] Mar. 21, 1972

[54] AUTOMATIC-RECYCLING SIGNAL-SEEKING VOLTAGE-CONTROLLED TUNER

[72] Inventor: Fredrick Zlotnick, Addison, Ill.

[73] Assignee: Zenith Radio Corporation, Chicago, Ill.

[22] Filed: Aug. 31, 1970

[21] Appl. No.: 68,081

[52] U.S. Cl. ................................325/461, 325/470, 334/15, 334/16

[51] Int. Cl. ................................H04b 1/32

[58] Field of Search .................333/17; 334/15, 16; 325/469, 325/470, 461

[56] References Cited

UNITED STATES PATENTS 3,189,829 6/1965 Bento et al. ..........................325/470

3,069,637 12/1962 Seeley, Jr. ..........................334/16

3,325,737 6/1967 Berman ..........................334/16 X

*Primary Examiner*—Herman Karl Saalbach

*Assistant Examiner*—Paul L. Gensler

*Attorney*—John J. Pederson and R. A. Blackstone

[57] ABSTRACT

A signal-seeking system for a voltage-controlled tuner wherein automatic recycling is achieved when the control voltage exceeds one limit of the control voltage range. A detector senses the control voltage exceeding its range and activates a restoring circuit which restores a storage capacitor to the voltage corresponding to the opposite end of the control voltage range. A switching circuit is responsive to the restoration operation to automatically shift the control voltage from one tuner to another in a multi-tuner embodiment. The switching circuit is also used to change the scanning rate of the signal-seeking system.

4 Claims, 3 Drawing Figures

Inventor
Fredrick Zlotnick

By R.A. Blackstone
Agent

Inventor
Fredrick Zlotnick
By R.A. Blackstone
Agent

AUTOMATIC-RECYCLING SIGNAL-SEEKING VOLTAGE-CONTROLLED TUNER

BACKGROUND OF THE INVENTION

Signal-seeking tuners are well known for their convenience and ease of operation, especially in the field of radio receivers. They are commonly used to provide automatic tuning of the next higher or lower frequency of interest in response to the mere momentary contact of a "start" switch. Signals too weak for satisfactory reception are usually skipped over by employing a minimum-threshold circuit in the signal detector portion of the signal-seeking system. To accomplish the signal-seeking operation, an electric motor is conventionally utilized for mechanically rotating a variable tuning device such as a variable ("gang") capacitor. The motor is initiated by the "start" switch and stopped at or near the frequency of interest by means of a signal detector and a feedback control loop. An automatic frequency control (AFC) circuit may also be employed to precisely tune the receiver to the exact frequency of the received signal and thereafter compensate for small variations in tuner components to maintain the precise tuning. Although rather bulky, clumsy, and expensive, the motor-driven signal-seeking tuner has found relatively wide acceptance.

With the advent of the solid-state, voltage-dependent variable-reactance devices, however, a substantially improved signal-seeking tuning system may be designed which eliminates the need for an electric motor and some of the associated circuitry to thereby provide a compact, lightweight, and more efficient system. Moreover, with the elimination of virtually all moving parts, the solid-state system is essentially immune to malfunction resulting from mechanical wear, dirt accumulation, and contact corrosion. The most common type of voltage-dependent variable-reactance device is a diode whose interelectrode capacitance is directly proportional to its reverse-bias voltage, commonly referred to as a "VARICAP" or "varactor" diode. By placing one or more varactor diodes in the frequency-selecting portion of a tuner, station selection may be achieved by progressively increasing or decreasing the voltage applied to the varactor diode until the desired frequency is selected. Obviously, by combining a varactor-diode tuner with an automatic, progressively-variable DC control voltage generator and a signal-detecting feedback control loop, a satisfactory solid-state signal-seeking tuning system may be obtained.

The range of the control voltage for such a system, however, must be sufficient to vary the varactor-diode capacitance enough to cause the tuner to scan its entire frequency band. Moreover, upon attaining either end of the control voltage range, and therefore of the frequency range, without finding a suitable signal, it is inconvenient and inefficient for a signal-seeking system to merely reverse the direction of the control voltage progression (even if done automatically) and retrace the same portion of the range before finding another suitable frequency, the way some conventional systems do. For example, if an FM radio tuner is set to the middle of the FM band, and one wishes to seek the next higher station, it is conceivable that in some circumstances there might not be another higher-frequency station on the air at that time. Consequently, a signal-seeking system that merely reverses direction upon reaching one end of the range will traverse the upper half of the FM band twice before finding a station and the first station it "finds" is the one it just left. Other conventional systems provide a reset means in the form of a manual switch for recycling the system which, of course, renders the system nonautomatic and adds a moving part.

It is therefore an object of the invention to provide a new and improved solid-state signal-seeking tuning system.

It is a more specific object of the invention to provide such a new and improved signal-seeking tuning system which is bidirectional and automatically recycles itself in either direction.

It is a further object of the invention to provide such a signal-seeking system which is highly adaptable to a multi-tuner receiver.

SUMMARY OF THE INVENTION

In a receiver having a signal-seeking system for a voltage-controlled tuner, wherein the tuner is caused to scan a predetermined frequency band by the application of a progressively-variable DC control voltage to at least one voltage-dependent variable-reactance tuning element in the tuner until completion of the signal-seeking operation, with the control voltage being variable throughout a predetermined DC voltage range assigned to the frequency band, a circuit constructed in accordance with the invention for automatically recycling the signal-seeking operation comprises an energy-storing device and means, including the device, coupled to the tuner for generating the control voltage at a predetermined charging rate and responsive to the completion of the signal-seeking operation for developing across the device a voltage corresponding to the instantaneous value of the control voltage assigned to the frequency of the signal selected by the signal-seeking system. Means are provided for applying the stored voltage to the voltage-dependent element to keep the receiver tuned to the signal selected to the signal-seeking system. A detector is coupled to the generating means and is responsive to the generation of a control voltage of an amplitude exceeding that of the voltage assigned to one of the limits of the frequency band for developing a control effect. Also provided are means coupled between the detector and the generating means and responsive to the control effect for applying a predetermined voltage to the storing device to restore the storing device to the voltage corresponding to that assigned the other limit of the frequency band, thereby automatically recycling the signal-seeking operation when the control voltage exceeds its range.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENT

Figure 1:
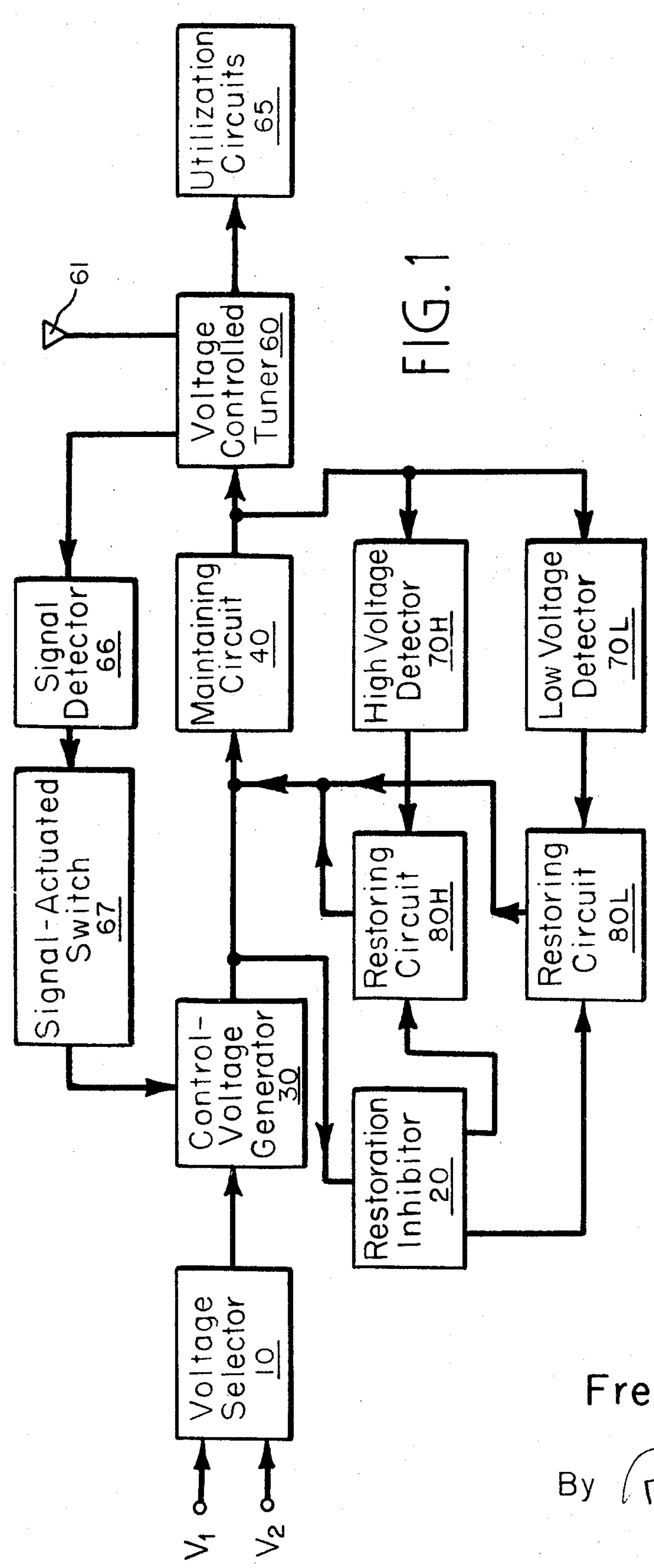
FIG. 1 is a block diagram illustrating the primary principles of the invention.

With reference to FIG. 1, the basic principles of the invention are illustrated in a block diagram of a receiver having a signal-seeking system for a voltage-controlled tuner 60, wherein the tuner is caused to scan a predetermined frequency band by the application of a progressively-variable DC control voltage to at least one voltage-dependent variable-reactance tuning element in the tuner until completion of the signal-seeking operation. The control voltage is variable throughout a predetermined DC voltage range assigned to the frequency band of the tuner. In accordance with the invention, a circuit is provided for automatically recycling the signal-seeking operation to establish the control voltage at the amplitude assigned to one limit of the frequency band when it exceeds that of the other. In other words, whenever the control voltage exceeds the amplitude corresponding to the highest frequency in the band, the system of the invention automatically recycles itself so that i continues seeking in the same direction (i.e., "up") starting at the lowest frequency in the band. It should be noted at this point that although a unidirectional system of this type (or one which seeks in a "- down" direction) may be preferred for some applications, the invention also provides a bidirectional system, as more fully described below. In addition, it should be understood that the invention is adaptable to any type of voltage-controlled tuner for which it is desired to have the signal-seeking feature, including AM or FM radios, UHF or VHF televisions or any combination thereof. Following this basic description of the principles of the invention, a preferred embodiment of the invention which is highly adaptable to a multi-tuner signal-seeking receiver, such as an AM-FM radio or a UHF-VHF television, is shown in schematic form in FIG. 2.

The basic signal-seeking system shown in FIG. 1 comprises a voltage selector 10 capable of selecting, for example, either a positive voltage $V_1$, to cause the system to seek the adjacent higher-frequency signal, or a less-positive (e.g., negative) voltage $V_2$, to cause the system to seek the adjacent lower-frequency signal. A control-voltage generator 30 is responsive to the voltage selected by voltage-selector 10 to generate either a positive-going or negative-going progressively-variable DC control voltage by means of an energy-storing device in the form of a capacitor 41 (see FIG. 2) in generator 30 and is responsive to the completion of the signal-seeking operation for developing across the capacitor a voltage corresponding to the instantaneous value of the control voltage assigned to the frequency of the signal selected by the signal-seeking system.

Means such as a wire or a maintaining circuit 40 are provided for applying the stored voltage to one or more voltage-dependent elements (e.g., varactor diodes) in voltage-controlled tuner 60 to keep the receiver tuned to the signal selected by the signal-seeking system, as explained below in greater detail. It is desirable to have such a maintaining circuit so that, upon reception of a particular frequency of interest, the tuner may remain at that frequency in spite of a momentary loss of signal caused by multipath cancellation due to airplanes, etc., or temporary transmitter failure. Without the maintaining circuit, of course, a momentary loss of signal would send the system seeking for another signal. Moreover, maintaining circuit 40 may be of any known construction, such as a feedback control system, in order to keep the receiver tuned to the previously-selected signal even when the receiver is turned off for an extended period of time, so that it does not require retuning when turned on again. A suitable antenna 61 is provided for intercepting the signals which the tuner is designed to receive, and the corresponding receiver circuitry, including the image or sound reproducer, is symbolically represented by the utilization circuits 65. Finally, the basic signal-seeking system is completed by a signal detector 66 and a signal-actuated switch 67 which are coupled between tuner 60 and generator 30 to determine when a suitable signal is tuned in and apply voltage $V_2$ to generator 30 to halt the operation thereof.

In accordance with the invention, means for automatically recycling the signal-seeking operation to establish the control voltage at one limit of its range when it exceeds the other, comprises a high-voltage detector 70H coupled to generating means 30 by way of maintaining circuit 40. Detector 70H is responsive to the generation of a control voltage of an amplitude exceeding that of the voltage assigned to the upper limit of the frequency band for developing a control effect which is applied to a restoring circuit 80H. Restoring means 80H is coupled between detector 70H and generator 30 and is responsive to the control effect for applying a predetermined voltage to the storing device in generator 30 (device not shown FIG. 1, see capacitor 41 in FIG. 2) to restore it to a voltage corresponding to that assigned to the lower limit of the frequency band, thereby automatically recycling the signal-seeking operation when the control voltage exceeds the upper limit of its range. Where it is desired to have the signal-seeking system automatically recycle in the opposite direction, that is, to start at the upper frequency limit and seek in the downward or decreasing-frequency direction when the control voltage exceeds its lower voltage limit (i.e., by falling below the limit), a similar circuit may be provided comprising a low-voltage detector 70L and a restoring circuit 80L. Low voltage detector 70L is also coupled to generating means 30 by way of maintaining circuit 40, and is responsive to the generation of a control voltage of an amplitude exceeding (i.e., below) that of the voltage assigned to the lower limit of the frequency band for developing a control effect which is applied to restoring circuit 80L. Restoring circuit 80L is likewise coupled between detector 70L and generator 30 and is responsive to the control effect from detector 70L for applying a predetermined voltage to the storing device in generator 30 to restore it to a voltage corresponding to that assigned to the lower limit of the frequency band, thereby automatically recycling the signal-seeking operation when the control voltage exceeds the lower limit of its range. Thus, the invention provides a new and improved signal-seeking system which is bidirectional and automatically recycles itself in either direction without any inefficient and inconvenient backtracking.

In accordance with a further aspect of the invention, a restoration inhibitor 20 is coupled between generator 30 and restoring circuits 80H and 80L and responsive to the polarity of the control voltage for temporarily disabling one of the restoring means so that the storing device in generator 30 cannot be restored to the voltage corresponding to one of the limits when the control voltage is progressing toward that limit. In other words, when the control voltage attains the upper voltage limit, high voltage detector 70H and restoring circuit 80H restore the storing device to the lower voltage limit and, without the disabling by inhibitor 20 of circuit 80L, low voltage detector 70L and restoring circuit 80L would then restore the storing device to the upper voltage limit. This operation would be repeated as long as the system remained energized, thereby creating an oscillatory condition.

Where tight tolerances are of no particular concern, the restoration inhibiting means may be omitted by designing the system with a control voltage range slightly broader than that required for the particular tuning band (and essentially centered with respect thereto) and by establishing the restoration voltage between the amplitude corresponding to the highest (or lowest) frequency in the tuning band and that assigned to the associated control-voltage limit, so that the aforementioned oscillatory condition is avoided. Moreover, where rapid recycling is not important, both the restoration inhibiting means and tight tolerances may be avoided by making the control voltage range much broader than that required for the particular tuning band so that the restoration voltage may be easily established between the amplitude corresponding to the frequency limit and that associated with control-voltage limit.

Figure 2:
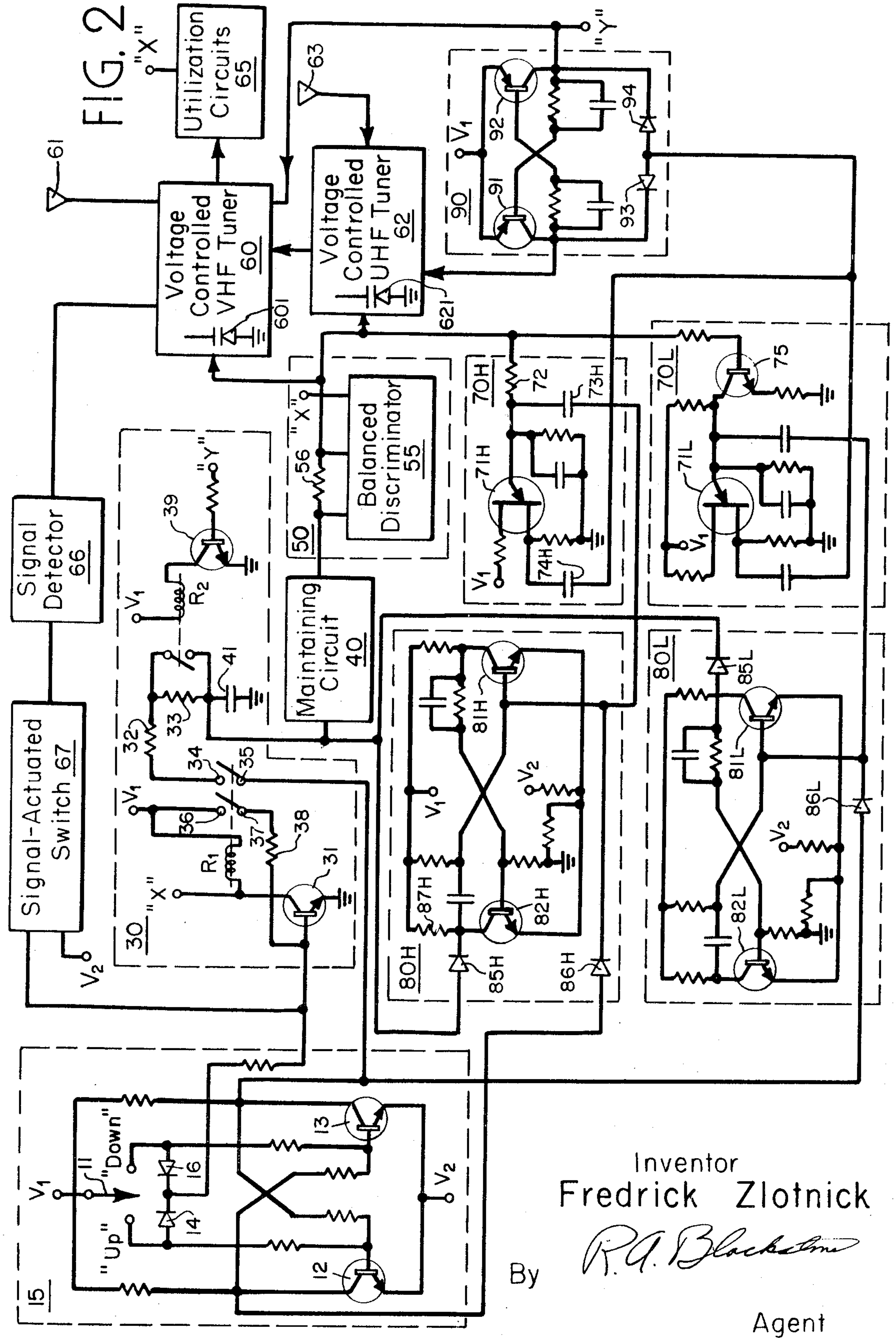
FIG. 2 is a schematic diagram of a preferred embodiment of the invention.

With reference to FIG. 2, a preferred embodiment of the invention for use with a television receiver having a combination VHF-UHF tuning system is shown in schematic diagram form. For the purposes of this discussion, a voltage-controlled VHF tuner 60 and a voltage-controlled UHF tuner 62 are represented by separate blocks having separate antennas 61 and 63, respectively, although no such structural limitation is thereby intended. Tuners 60 and 62 each have at least one voltage-dependent variable-reactance tuning element in the form of varactor diodes 601 and 621, respectively. In addition, voltage-controlled VHF tuner 60 and UHF tuner 62 can just as well be voltage-controlled AM and FM tuners, or any other type of voltage-controlled tuners. Moreover, the invention is not limited to two tuners inasmuch as it is equally adaptable to any number of voltage-controlled tuners. The remaining receiver circuitry forms no part of this invention and is therefore represented by a single block designated by utilization circuits 65. Similarly, the particular type of signal detector and signal-actuated switch employed do not comprise an essential element of the invention and they are accordingly exemplified by blocks 66 and 67, respectively.

A circuit 15 combines the functions of voltage selector 10 and inhibitor 20 to provide means for initiating the signal-seeking operation in either an "up" or a "down" direction; that is, in a direction of increasing frequency or decreasing frequency, respectively. Circuit 15 is supplied by two voltage sources $V_1$ and $V_2$ which may be of opposite polarity and, for example, may have respective values of +70 volts and −40 volts. The signal-seeking operation is initiated in response to a mere momentary closing of the switch 11 to either the "up" or "down" contact. Closing switch 11 in either position supplies a voltage to a relay-driver transistor 31 of control-voltage generator 30, by means of a pair of diodes 14, 16, and simultaneously drives the bistable multivibrator circuit comprising a pair of transistors 12 and 13 to one of its stable states. A pair of contacts 34, 35 on a relay $R_1$ are thereby closed to initiate generation of a progressively-variable DC control voltage by applying the collector voltage of transistor 13 (which, by virtue of the bistable multivibrator, is positive for "up" searching, negative for "down") to an energy-storing device in the form of capacitor 41 by means of resistors 32 and 33. The signal-seeking operation is thus maintained in the mode selected until the receiver is tuned to a suitable signal or until the bistable multivibrator is driven to its other stable state by the closing of switch 11 to the opposite contact.

A relatively small low-power-consumption reed relay has been found to be quite acceptable for relay $R_1$. A second pair of contacts 36, 37 are provided on relay $R_1$ for effectively making it self-latching; that is, once energized by transistor 31, contacts 36, 37 apply a sustaining voltage ($V_1$) to the base of transistor 31 through resistor 38 to keep transistor 31 turned on and maintain the energization of relay $R_1$ until transistor 31 is turned off by application of voltage $V_2$ to the base thereof by signal-actuated switch 67 in response to signal detector 66 when a suitable signal is detected thereby. Relay $R_1$ is thus deenergized to thereby halt the charging (or discharging) of capacitor 41 in order to complete the signal-seeking operation.

Maintaining circuit 40 is coupled to tuners 60 and 62 by way of an automatic frequency control (AFC) circuit 50 comprising a balanced discriminator 55 for providing a compensating error signal across a resistor 56 to adjust the control voltage applied to the tuners. Maintaining circuit 40, through AFC circuit 50, applies the control voltage to the voltage-dependent elements 601 and 621 in the tuners, to thereby keep the receiver tuned to the selected signal after generator 30 is disabled.

The values of resistors 32 and 33 and capacitor 41 are selected to provide a time constant suitable for generating a control voltage which causes a voltage-controlled tuner to scan through its frequency band at a desirable rate. In a multi-tuner application of the invention, it may be desirable to have the same control-voltage range yet different scanning rates for the different frequency bands of the various tuners. For example, it has been found desirable to scan the 12-channel VHF band in five seconds and the 70-channel UHF band in twelve. Accordingly, a second relay $R_2$ driven by transistor 39 is provided in generator 30 to short resistor 33, thereby decreasing the time constant to increase the scanning rate whenever the VHF tuner is activated. Applying an appropriate signal to terminal "Y" suits this purpose, as explained below.

Maintaining circuit 40 is not essential for practicing the invention but is provided in order to maintain the voltage on capacitor 41 at its aforementioned instantaneous value. Circuit 40 is desirable because capacitor 41 is not practically realizable as an ideal capacitor; that is, it typically has some leakage and therefore loses some of its charge with time. Circuit 40 may comprise a high impedance feedback circuit of some sort to maintain the initial charge on capacitor 41 or any other known construction. Thus the tuner may be maintained at the selected frequency for a relatively long period of time without the control voltage changing due to imperfections in the system or the passage of time, as when the set is turned off for a while.

It should be noted that AFC circuit 50 is not necessary to the practice of the invention but is especially desirable in a color-TV application of the invention where precise tuning is mandatory for proper reception, and is sometimes difficult to obtain by the average user with a receiver without AFC. This circuit may of course be of any known construction. Terminal "X" is provided to receive a signal from the correspondingly designated terminal connected to the collector of transistor 31 in generator 30 to disable balanced discriminator 55 during the signal-seeking operation. This same signal may also be used to provide a muting signal to the receiver to mute audio and/or video during scanning. A correspondingly designated terminal "X" is provided on utilization circuits 65 for this purpose. The thus-tailored control voltage is simultaneously applied to voltage-controlled VHF tuner 60 and voltage controlled UHF tuner 62. An additional switching circuit 90 may be incorporated to effectively shift the control voltage from one tuner to the other by applying the control voltage to only one of the tuners, or making one tuner selectively responsive to the control voltage, so that both are not operative at the same time, as hereinafter described in greater detail.

Detector means 70H comprises a unijunction transistor 71H biased to turn on only when the voltage applied to its emitter (i.e., the control voltage) exceeds the upper limit of the control-voltage range. Transistor 71H turns on rapidly enough to develop a control effect in the form of a negative pulse at its emitter which is applied, by means of capacitor 73H, to the base of transistor 81H which, together with transistor 82H, forms a monostable multivibrator circuit which serves as restoring means 80H. A positive pulse is simultaneously developed at the lower-potential base of transistor 71H and is applied to circuit 90 by means of capacitor 74H. The utilization of this positive pulse is described below.

The monostable multivibrator of restoring circuit 80H is biased so that transistor 81H is normally turned on and transistor 82H is normally turned off. By connecting diode 85H between capacitor 41 and the collector of transistor 82H, with the cathode of the diode connected to the latter, diode 85H is normally reverse biased and therefore presents a very high impedance to capacitor 41. Temporarily turning off transistor 81H with the negative pulse from detector 70H, however, temporarily turns on transistor 82H causing its collector voltage to decrease sufficiently to forward bias diode 85H and thereby discharge capacitor 41 to the level of the collector voltage of transistor 82H. Proper selection of load resistor 87H and supply voltages $V_1$ and $V_2$ establishes the "on" collector voltage of transistor 82H at the lower limit of the control voltage range. In addition, the time constant of the multivibrator circuit is made sufficiently long to properly discharge capacitor 41 yet short enough to provide quick operation so that little time is lost during recycling. 82H.

Similarly, low voltage detector 70L comprises a unijunction transistor 71L biased to turn on when the control voltage exceeds (i.e., falls below) that lower limit of the control voltage range. To allow for use of the same type of unijunction-transistor threshold-sensing circuit in detector 70L as in 70H, however, an additional transistor 75 is provided to invert the control voltage. Low voltage detector 70L and restoring circuit 80L operate in the same manner as high voltage detector 70H and restoring circuit 80H except for the diode 85L which is here connected between capacitor 41 and the collector of transistor 81L CONNECTED BETWEEN CAPACITOR $- AND THE COLLECTOR OF which is normally turned on. Diode 85L is connected as shown so that it is normally reverse biased to present a very high impedance to capacitor 41. Temporarily turning off transistor 81L with the negative pulse from detector 70L, however, causes the collector voltage of transistor 81L to temporarily increase sufficiently to forward bias diode 85L and thereby charge capacitor 41 to a level equal to the upper limit of the control-voltage range. Once again, proper selection of the circuit components establishes the correct voltage level for the "off" collector voltage of transistor 81L.

The restoration inhibiting discussed above in regard to FIG. 1 is provided in the embodiment in FIG. 2 by respectively connecting a pair of diodes 86H, 86L between the collectors of transistors 12, 13 and the bases of transistors 81H, 81L. When switch 11 has been actuated to the "up" position, the collector voltage of transistor 13 is positive because transistor 13 is turned off. This positive voltage keeps transistor 81L turned on regardless of any negative pulses from detector 70H to thereby inhibit restoring circuit 80L. Similarly, a positive voltage is applied to the base of transistor 81H through diode 86H when switch 11 has been actuated to the "down" position to thereby inhibit restoring circuit 80H. Of course, there are other ways of inhibiting the restoration including applying the inhibiting voltage to the detector circuits instead of the storing circuits.

In accordance with a further aspect of the invention, a switching circuit 90 is coupled to detectors 70H and 70L and responsive to the control effects developed thereby to effectively shift the signal-seeking system to the UHF tuner when the control voltage exceeds either limit of the voltage range assigned to the VHF tuner, and vice versa. Circuit 80 employs a bistable multivibrator comprising transistors 91 and 92 and diodes 93 and 94. The aforementioned positive pulses from the lower-potential bases of transistors 71H and 71L are applied to the junction of the anodes of diodes 93 and 94 to trigger the bistable multivibrator; one pulse turns on transistor 91, for example, and the next turns on transistor 92. Thus, as the control voltage successively exceeds either limit of its range, tuners 60 and 62 are alternately energized automatically by circuit 90 to thereby be made selectively responsive to the DC control voltage. Consequently, each time the corresponding detecting circuit senses the control voltage exceeding its range, not only is the signal-seeking system recycled but the frequency band is changed as well. Circuit 90 completely controls tuners 60 and 62 in FIG. 2 so there can be no ambiguity in the system. A TV receiver may therefore be consecutively tuned through the UHF band and then the VHF band and then the UHF band again indefinitely and in either direction. The system of the invention is similarly adaptable to an FM-AM radio, or even a combination unit having all four types of tuners.

Circuit 90 may also be used to provide a switching voltage at terminal "Y" for application to the correspondingly designated terminal of generator 30 to activate relay $R_2$ and thereby change the charging rate of control-voltage generator 30, thereby providing an appropriate scanning rate for the tuner to which the control voltage is effectively applied. Thus, different scanning rates to accommodate frequency bands having different bandwidths are provided while utilizing the same control-voltage range (and therefore similar circuitry) for each tuner, as discussed above. In the embodiment shown in FIG. 2, transistor 39 in circuit 30 is turned on whenever VHF tuner 60 is operative under the control of circuit 90.

Figure 3:
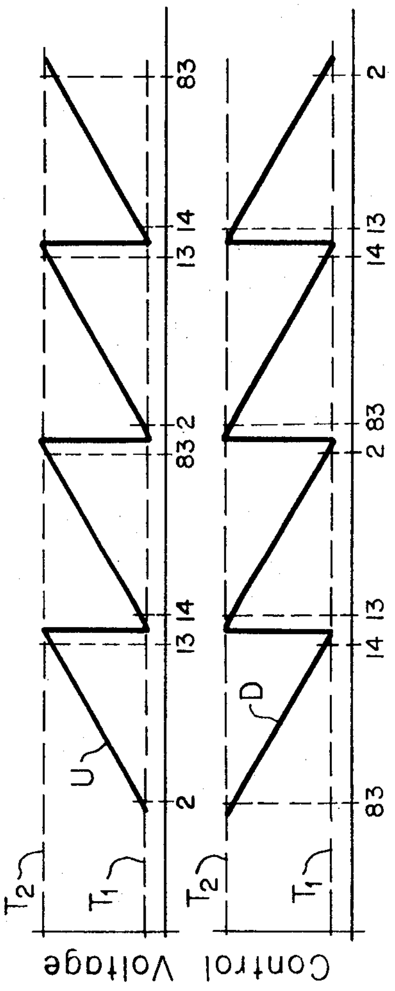
FIG. 3 is a graphical representation useful in understanding the invention.

FIG. 3 graphically illustrates the waveforms of the control voltage for the preferred embodiment of the invention, shown in FIG. 2. Dashed lines $T_1$ and $T_2$ represent the lower and upper limits of the voltage range corresponding to the frequency band to be scanned. The control voltage waveform represented by curve U illustrates scanning in the "up" direction; that is, starting at VHF channel 2 and progressing toward channel 13. When the control voltage exceeds the voltage level assigned to channel 13 and attains the upper limit of its range ($T_2$), the system of the invention automatically recycles the signal-seeking operation by restoring the storing means to the lower limit of the control-voltage range ($T_1$). Generally, it is preferable to provide a safety factor by setting the upper and lower limits of the control-voltage range ($T_1$ and $T_2$) slightly beyond the extreme channels within the range.

In addition, by incorporating circuit 90 as discussed above with reference to FIG. 2, the control voltage is also effectively shifted to the UHF tuner when it exceeds either limit of the VHF range. Thus, after passing channel 13 without finding a suitable signal, the signal-seeking system of the invention continues scanning upwardly through channels 14 and through 83. Again, when the control voltage exceeds the voltage level corresponding to channel 83 and attains the upper limit of the range, the signal-seeking operation is automatically recycled by the restoration of the storing device (capacitor 41) to the lower limit $T_1$. Once again, switching circuit 90 senses the restoration operation and effectively shifts the control voltage from the UHF tuner to the VHF tuner.

Similarly, curve D in FIG. 3 represents the waveform of the control voltage as it is progressively varied in the "down" direction to cause the UHF tuner to scan its frequency band starting at channel 83 and ending at channel 14. When the control voltage attains threshold level $T_1$, the signal-seeking system is automatically recycled by the restoration of the storing device and the VHF tuner is then caused to scan its frequency band starting with channel 13 and ending with channel 2.

Thus there has been shown and described a new and improved signal-seeking voltage-controlled tuner in which the signal-seeking operation is automatically recycled. The results are achieved with relatively simple solid-state circuits to thereby provide for efficient and economical operation. Moreover, the invention provides bidirectional automatic recycling for one or more tuners or frequency bands.

While a particular embodiment of the invention has been shown and described, it will be obvious to those skilled in the art that changes and modifications may be made without departing from the invention in its broader aspects and, therefore, the aim in the appended claims is to cover all such changes and modifications as fall within the true spirit and scope of the invention.

I claim:

1. In a receiver having a signal-seeking system for a voltage-controlled tuner, wherein the tuner is caused to scan a predetermined frequency band by the application of a progressively-variable DC control voltage to at least one voltage-dependent variable-reactance tuning element in said tuner until completion of the signal-seeking operation, the control voltage being variable throughout a predetermined DC voltage range assigned to said frequency band, a circuit for automatically recycling the signal-seeking operation comprising:

an energy-storing device;

means, including said device, coupled to said tuner for generating said control voltage at a predetermined charging rate and responsive to the completion of said signal-seeking operation for developing across said device a voltage corresponding to the instantaneous value of the control voltage assigned to the frequency of the signal selected by the signal-seeking system;

means for applying said developed voltage to said voltage-dependent element to keep the receiver tuned to the selected signal;

a high-voltage detector coupled to said generating means and responsive to the generation of the control voltage of an amplitude exceeding that of the voltage assigned to one of the limits of said frequency band for developing a first control effect;

a low-voltage detector coupled to said generating means and responsive to the generation of the control voltage of an amplitude exceeding that of the voltage assigned to the other of said limits of said frequency band for developing a second control effect;

restoring means coupled between said detectors and said generating means and responsive to said control effects for applying a predetermined voltage to said storing device to restore said storing device to a voltage corresponding to that assigned to the other limit of said frequency band, thereby automatically recycling the signal-seeking operation when the control voltage exceeds its range;

and restoration inhibiting means coupled between said generating means and said restoring means and responsive to said control voltage for temporarily disabling said restoring means.

2. An automatic-recycling signal-seeking system, according to claim 1, in which said inhibiting means temporarily disables said high-voltage restoring circuit as the control voltage progresses toward the voltage assigned to the upper frequency limit and temporarily disables said low-voltage restoring circuit as the control voltage progresses toward the voltage assigned to the lower frequency limit.

3. An automatic-recycling signal-seeking system according to claim 1, which further comprises a plurality of voltage-controlled tuners and switching means coupled to said detector and responsive to said control effect for effectively shifting the control voltage from one tuner to another.

4. An automatic-recycling signal-seeking system according to claim 3, which further comprises means coupled to said switching means and responsive to said control effect for changing said charging rate, thereby providing different scanning rates for said tuners.

* * * * *